United States Patent
Kang et al.

(10) Patent No.: US 7,358,142 B2
(45) Date of Patent: Apr. 15, 2008

(54) METHOD FOR FORMING A FINFET BY A DAMASCENE PROCESS

(75) Inventors: Hee-Soo Kang, Gyeonggi-do (KR); Chul Lee, Seoul (KR); Tae-Yong Kim, Gyeonggi-do (KR); Dong-Gun Park, Gyeonggi-do (KR); Young-Joon Ahn, Daejeon (KR); Choong-Ho Lee, Gyeonggi-do (KR); Sang-Yeon Han, Gyeonggi-do (KR)

(73) Assignee: Samsung Electronics Co., Ltd., Suown-si, Gyeonggi-do (KR)

( * ) Notice: Subject to any disclaimer, the term of this patent is extended or adjusted under 35 U.S.C. 154(b) by 367 days.

(21) Appl. No.: 11/046,623

(22) Filed: Jan. 28, 2005

(65) Prior Publication Data

US 2005/0170593 A1  Aug. 4, 2005

(30) Foreign Application Priority Data

Feb. 2, 2004  (KR) .................... 10-2004-0006557

(51) Int. Cl.
*H01L 21/336* (2006.01)
(52) U.S. Cl. ............... 438/283; 438/296; 257/E21.442; 257/E29.275
(58) Field of Classification Search ........ 438/283, 438/296
See application file for complete search history.

(56) References Cited

U.S. PATENT DOCUMENTS

| | | | |
|---|---|---|---|
| 6,525,403 B2 | 2/2003 | Inaba et al. | |
| 6,642,090 B1 | 11/2003 | Fried et al. | |
| 6,846,734 B2* | 1/2005 | Amos et al. | 438/592 |
| 6,951,784 B1* | 10/2005 | Anderson et al. | 438/157 |
| 2002/0036290 A1 | 3/2002 | Inaba et al. | |
| 2003/0113970 A1 | 6/2003 | Fried et al. | |
| 2003/0178670 A1 | 9/2003 | Fried et al. | |
| 2004/0063286 A1* | 4/2004 | Kim et al. | 438/283 |
| 2005/0153490 A1* | 7/2005 | Yoon et al. | 438/164 |

* cited by examiner

*Primary Examiner*—Alexander Ghyka
(74) *Attorney, Agent, or Firm*—Marger Johnson & McCollom, P.C.

(57) ABSTRACT

A device isolation film and an active region are formed on a semiconductor substrate, using a first mask pattern to expose only a formation region of the device isolation film. Only the device isolation film is selectively etched by using the first mask pattern and a second mask pattern as an etch mask, to form a fin only on a gate formation region, the second mask pattern to expose only a gate electrode formation region. A gate insulation layer is formed on both sidewalls of the fin and a gate electrode covering the first mask pattern and the gate insulation layer is formed. Source and drain regions are formed on the remaining portion of the active region where the gate electrode was not formed. Gate electrode separation becomes adequate and manufacturing costs can be reduced.

5 Claims, 8 Drawing Sheets

METHOD FOR FORMING A FINFET BY A DAMASCENE PROCESS

CROSS REFERENCE TO RELATED APPLICATIONS

This application claims priority from Korean Patent Application No. 2004-6557, filed on Feb. 2, 2004, the contents of which are hereby incorporated by reference for all purposes.

BACKGROUND OF THE INVENTION

1. Field of the Invention

This disclosure relates to the manufacturing of semiconductor devices, and more particularly, to a method of manufacturing an FinFET by a damascene process.

2. Description of the Related Art

Metal oxide semiconductor field effect transistors (MOSFET) have been increasingly miniaturized for higher performance and integration. For an integration increase of such a device, new techniques have been constantly proposed. This has brought about a development of devices prominent in their aspects of operation and size.

A technique to enhance an integration of a fin field effect transistor (FinFET) has been proposed. In this FinFET, a body region of a transistor is formed by a vertical structure in such a way that a shape of the transistor is similar to a fish's dorsal fin, thus providing the name of a FinFET.

Such a FinFET uses all upper parts and both side faces of a fin as a channel, in comparison with the existing transistor that uses only one face, thus increasing electrical current by three times than that of the existing transistor. A gate has a structure surrounding a fin, thus increasing a current control capability of a gate for a device, and solving problems such as a short channel effect, etc., caused in the existing transistor.

However, there are several problems if such a fin transistor structure is actually applied to a memory device. In a tri-gate structure in which a gate is formed on an upper part and both side faces of the fin, a driving capability of the gate formed on the upper part of the fin is lowered compared with a gate formed on both side faces. In a pre-doping of a gate electrode, to prevent degradation of device current characteristic caused by gate depletion, etc., when forming an SRAM (Static Random Access Memory), etc., gate heights of upper portions and both side portions of the fin are different, thus a sufficient doping effect cannot be guaranteed. To solve these problems, a double gate fin transistor in which a gate is formed only on both side faces of the fin has been developed. A conventional technique of forming the double gate fin transistor has been disclosed in U.S. Pat. No. 6,642,090.

In forming a gate electrode according to the conventional technique, a fin is formed and then an etching process for a device isolation film surrounding the fin is performed to expose a predetermined portion of a fin type active region. Then, a conductive layer is deposited. The conductive layer is etched in a predetermined pattern to form a gate electrode. Such a process of forming the gate electrode not only increases an absolute etch amount necessary for the formation of the gate electrode, but may also bring about a short between gate electrodes caused by a marginal gate electrode separation. An active region is formed in a fin type, thus an area of source and drain regions is reduced and this influences a contact and silicide formation. This also causes a resistance increase, lowering a current improvement of a fin transistor.

SUMMARY OF THE INVENTION

Exemplary embodiments of the invention provide a method of fabricating a FinFET. The method provides a reduction of costs in using an existing conventional transistor fabricating process, and prevents or substantially reduces a short between gate electrodes by forming a gate electrode by a damascene process, together with an adequate gate electrode separation. The method is advantageous for a contact and silicide formation of source and drain regions by forming a fin only on a gate formation region. The method prevents damage to an active region in a subsequent process by not removing a mask pattern for a formation of a device isolation film.

BRIEF DESCRIPTION OF THE DRAWINGS

The above and other features of exemplary embodiments of the invention will become readily apparent from the description that follows, with reference to the attached drawings, in which:

FIGS. 2a to 8b are sectional views sequentially illustrating processes taken along lines I-I' and II-II' in FIG. 1.

DETAILED DESCRIPTION OF THE PREFERRED EMBODIMENTS

Exemplary embodiments of the invention are more fully described in detail with reference to the accompanied drawings. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

Figure 1:
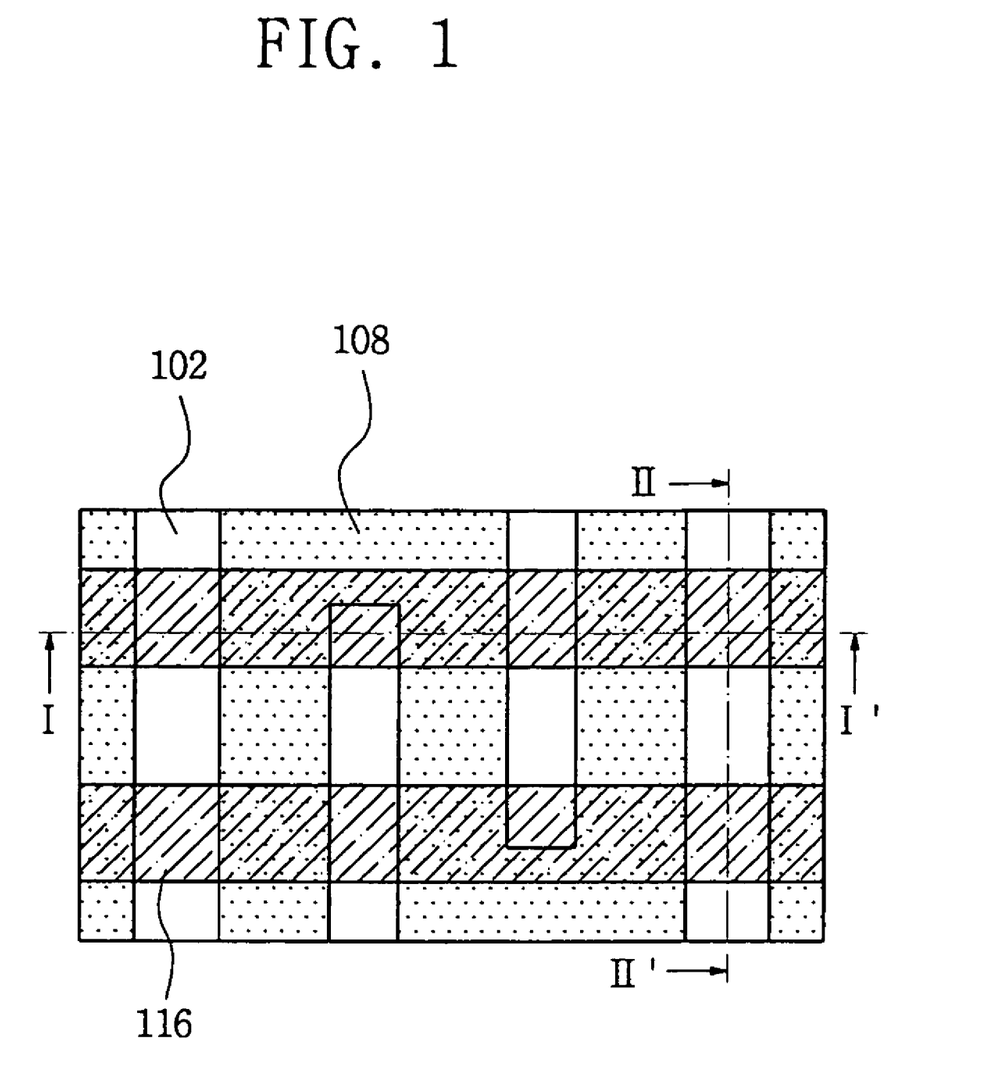
FIG. 1 is a layout of a FinFET according to an exemplary embodiment of the invention.

FIG. 1 is a layout of a FinFET according to an exemplary embodiment of the invention.

Referring to FIG. 1, an active region 102 formed on a semiconductor substrate is defined by a device isolation film 108, and a gate electrode is formed on a portion of the active region 102.

For reference, in FIGS. 2a to 8b, the drawing numbers with a character 'a' are cross-sectional views taken along line I-I' in FIG. 1, and the drawing numbers with a character 'b' are cross-sectional views taken along line II-II' in FIG. 1.

Figure 2A:
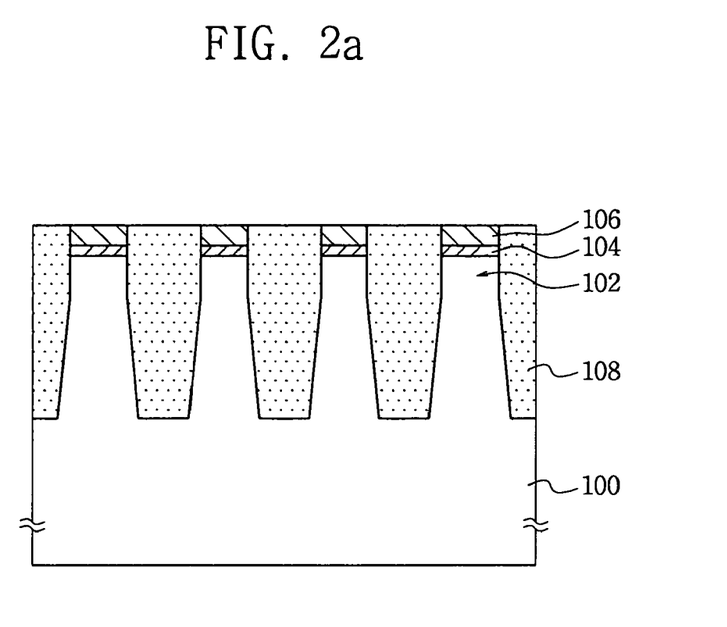
Figure 2B:
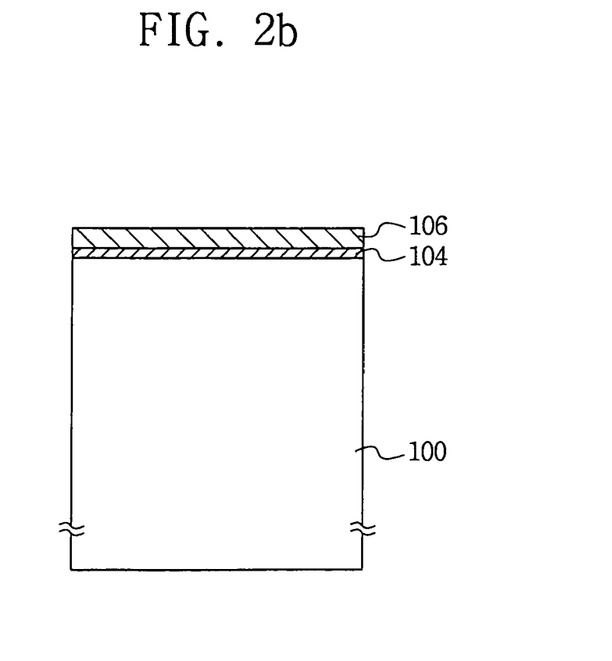

Referring to FIGS. 2a and 2b, a bulk semiconductor substrate 100 is provided, and a first mask pattern 106 is formed on the bulk semiconductor substrate 100. To protect the semiconductor substrate 100 before forming the first mask pattern 106, a buffer layer 104 of oxide layer material, etc., may be formed on the semiconductor substrate.

An insulation layer is formed to a predetermined thickness on the semiconductor substrate 100 or the buffer layer 104. The insulation layer may be formed by, e.g., an LPCVD (Low Pressure Chemical Vapor Deposition) or a PECVD (Plasma Enhanced Chemical Vapor Deposition), etc., and may be formed of SiN material.

Next, a photoresist pattern (not shown) to expose a portion where the device isolation film 108 will be formed, is formed on the insulation layer, and a portion of the insulation layer is etched until the buffer layer 104 or the semiconductor substrate 100 is exposed, using the photoresist pattern as a mask, thereby forming the first mask pattern 106.

The semiconductor substrate 100 is etched by using the first mask pattern 106 as an etch mask to form a trench. The trench may be formed in a size equal to a size obtained by a formation procedure of a general planar type transistor; and the active region defined by the trench may also have a size equal to an active region obtained when forming a planar type transistor. Thus, the existing process can be used, reducing additional costs. The etching process to form the trench may employ a dry etching etc. as an anisotropic etching process.

A device isolation insulation layer is formed on the semiconductor substrate 100 to fill the trench therein. The device isolation insulation layer may be formed by an oxide deposition process using high density plasma. To protect the active region before forming the device isolation insulation layer, an oxide layer is grown inside the trench, and a nitride liner may be optionally formed thereon. The nitride liner is provided to protect the active region in a process of isolating the active region.

On the semiconductor substrate 100 on which the device isolation insulation layer was formed, a planarization process, such as a chemical mechanical polishing (CMP), in which the first mask pattern 106 is used as a planarization stop layer, is performed, to form the device isolation film 108. The device isolation film 108 is formed to be equal to an upper height of the first mask pattern 106.

Figure 3A:
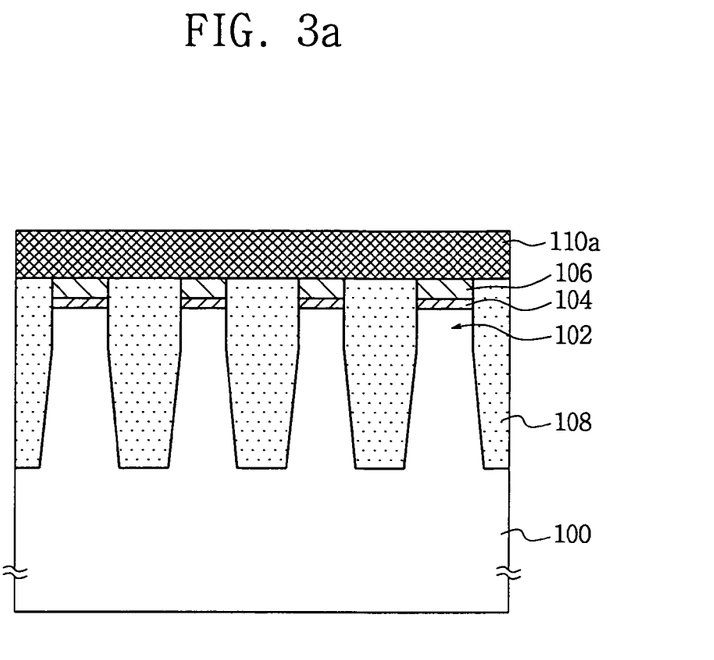
Figure 3B:
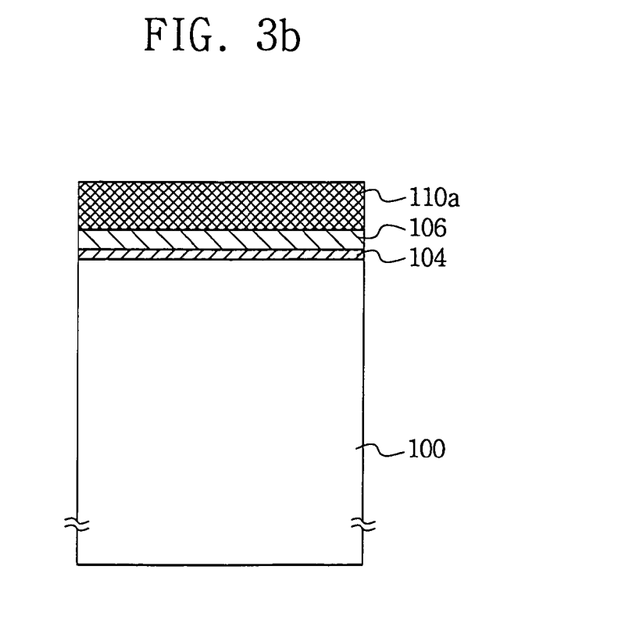

As shown in FIGS. 3a and 3b, an insulation layer 110a to form a second mask pattern 110 is formed on the semiconductor substrate 100. The insulation layer 110a for the formation of the second mask pattern 110 may be formed by depositing a nitride layer by an LPCVD, or PECVD process, etc., and may be formed of a multi-layer structure of nitride and oxide layers.

Figure 4A:
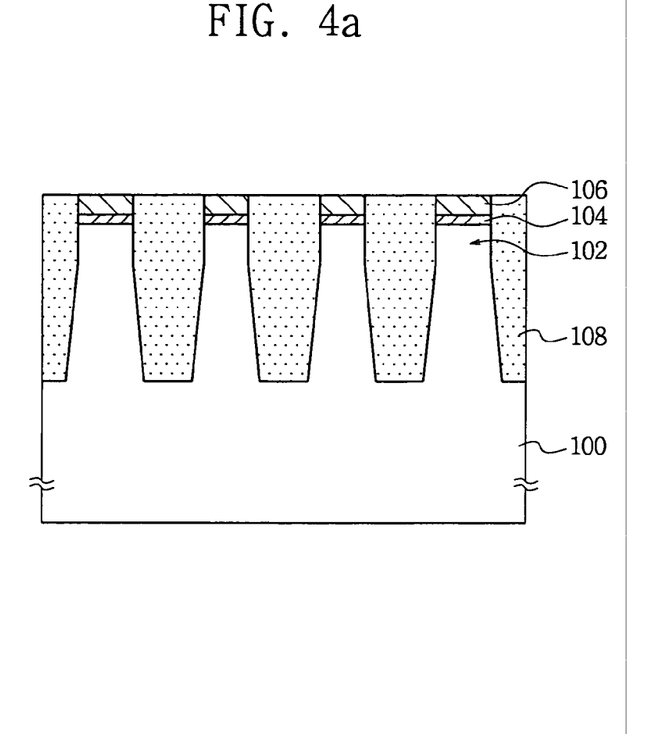
Figure 4B:
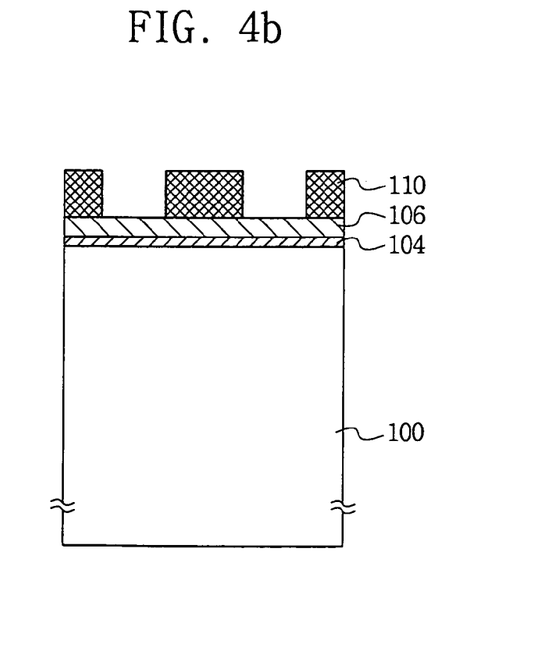

As shown in FIGS. 4a and 4b, a photoresist pattern (not shown) to expose only a region where a gate electrode will be formed is formed on the insulation layer 110a. Then the insulation layer 110a is etched until an upper part of the device isolation film 108 is exposed, using the photoresist pattern, thereby forming the second mask pattern 110. At this time, on the region where the gate electrode will be formed, upper parts of the device isolation film 108 and the first mask pattern 106 are left exposed. The first mask pattern 106 will serve as a protective layer to prevent damage to the active region in a post process.

Figure 5A:
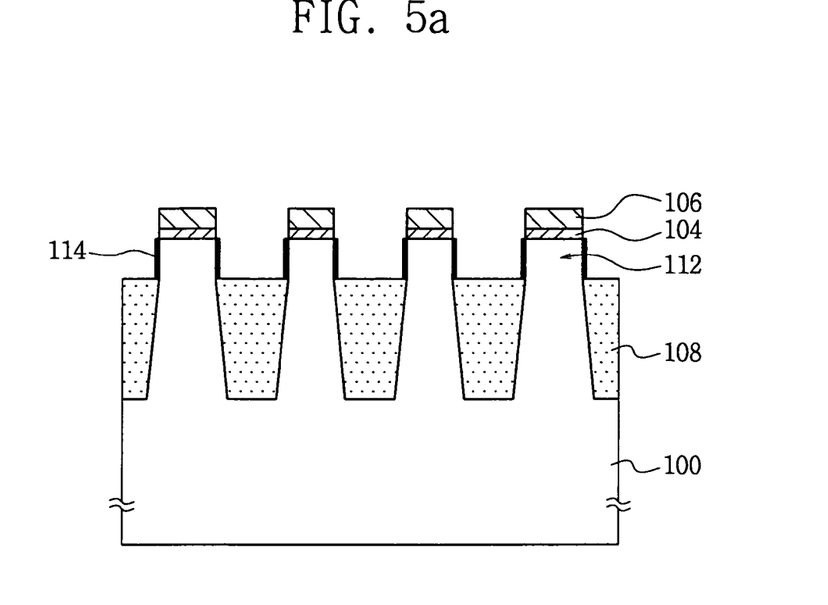
Figure 5B:
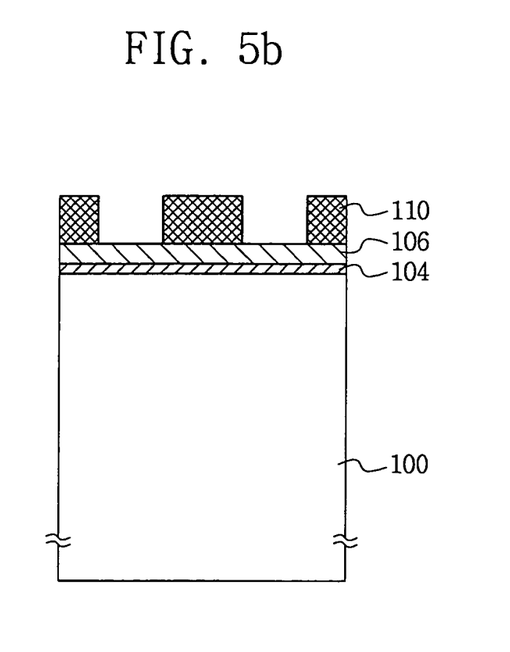

With reference to FIGS. 5a and 5b, a region of the device isolation film 108, on which a gate electrode will be formed, is etched by a predetermined depth by an etching process using the second mask pattern 110 and the first mask pattern 106 as an etch mask. Thus, both side faces of the active region 102 are exposed only by a gate formation region, to form a fin 112. The process of etching the device isolation film 108 may be an anisotropic etching process, and may be performed by etching to a depth of about 500 to about 2000 Å. The anisotropic etching process may employ a dry etching or an etch method using a plasma. The fin 112 may be formed by removing an exposed oxide layer and nitride liner if an oxide layer and a nitride liner was used.

A trimming process may be further added to control a thickness between both sidewalls of the fin, after forming the fin 112.

The trimming process is performed to obtain a desired thickness by repeatedly performing a process of growing an oxide layer on both sidewalls of the fin 112 that was formed on the gate formation region and removing it. The process of removing the grown oxide layer may be performed by an etching process, e.g., wet etching.

As described above, an area of source and drain regions is reduced by forming a fin only on a gate formation region, thereby preventing several problems of the prior art.

Subsequently, a gate insulation layer 114 is formed on both sidewalls of the fin 112. The gate insulation layer 114 may be formed of an oxide layer, or may be formed of other dielectric materials.

Figure 6A:
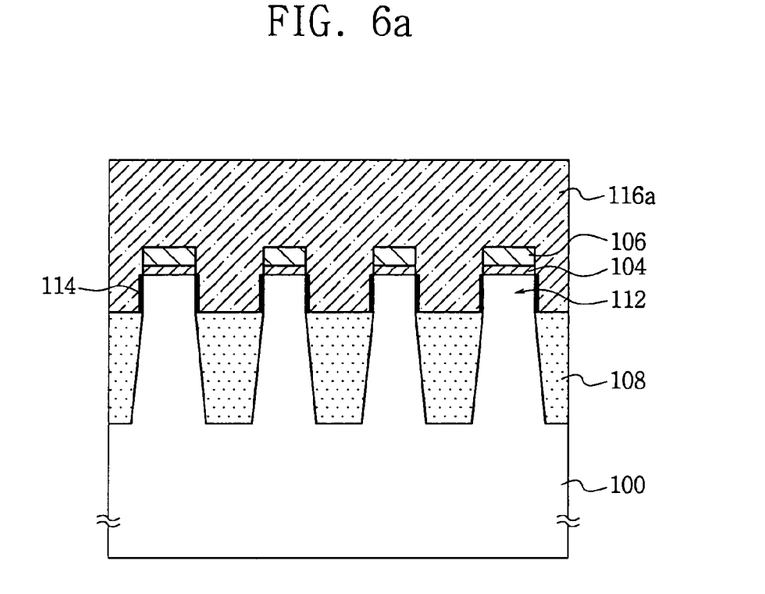
Figure 6B:
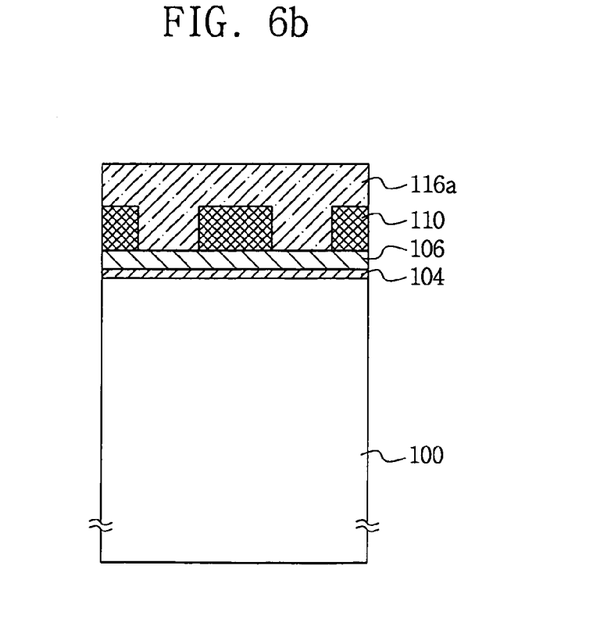

Referring to FIGS. 6a and 6b, a gate electrode conductive layer 116a is formed overlying the gate insulation layer 114. The conductive layer 116a is formed to fill an upper part of the first mask pattern 106 that was formed on the fin 112, and both sidewalls of the fin 112 on which the gate insulation layer 114 was formed. The conductive layer 116a is formed of a polysilicon material, and may also be formed of a metal layer or other conductive material.

Figure 7A:
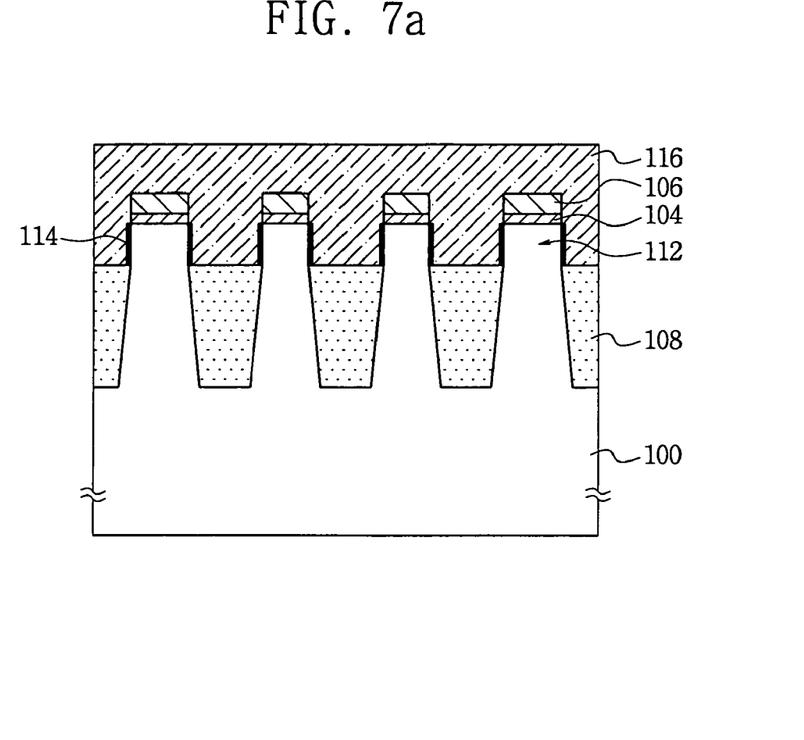
Figure 7B:
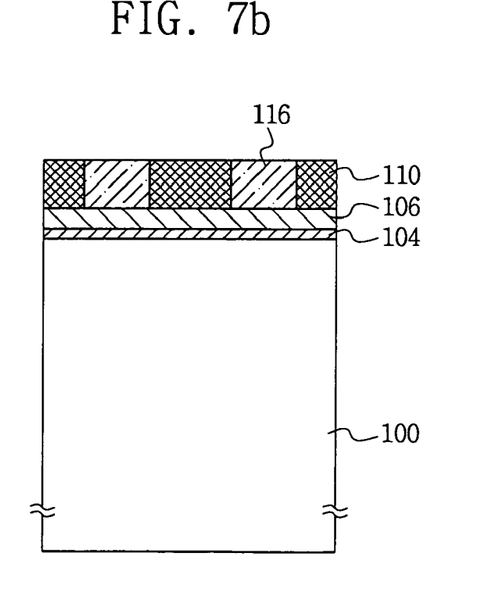

With reference to FIGS. 7a and 7b, a planarization process is performed on the semiconductor substrate on which the conductive layer 116a is formed, to form a gate electrode 116. The planarization process may employ, e.g., a CMP or etch back etc., and is performed by using the second mask pattern 110 as a planarization stop layer. The gate electrode 116 formed by such a planarization process is formed to be equal to an upper height of the second mask pattern 110. If the second mask pattern 110 is multi-layer, a layer provided on the second mask pattern 110 may be partially removed by a planarization process. Thus an upper part of the gate electrode 116 may be equal to a height of the second mask pattern 110 provided after the planarization process. A gate electrode separation becomes adequate by forming a gate electrode by a damascene process as described above.

Figure 8A:
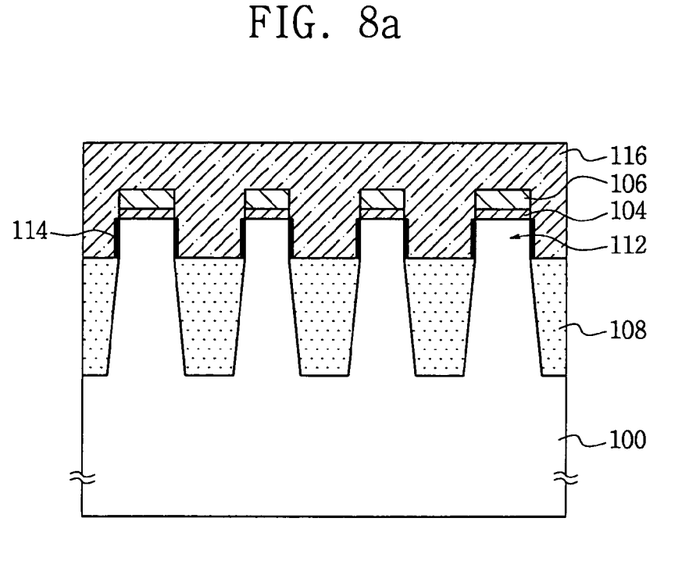
Figure 8B:
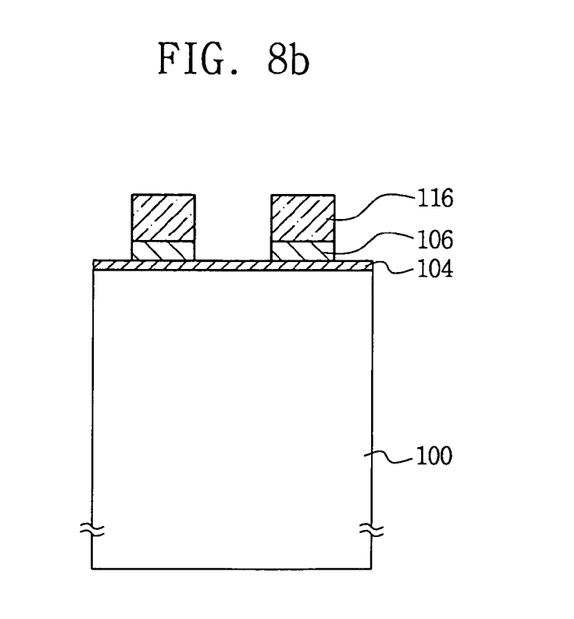

Referring to FIGS. 8a and 8b, the first mask pattern 106 and the second mask pattern 110, corresponding to a portion where the gate electrode 116 was not formed, are removed. The removal of the first mask pattern 106 and the second mask pattern 110 may employ a wet etch or dry etching.

After the removal of the first mask pattern 106 and the second mask pattern 110, an ion implantation is performed in the remaining portion of the active region where the gate electrode 116 was not formed, by interposing the gate electrode 116, thus forming source and drain regions, and so the fabrication of the FinFET is completed.

The FinFET formed by the above-described processes may be preferably applied to a DRAM (Dynamic Random Access Memory) cell, and of course may be applied to other memory devices such as SRAM, etc.

As described above, according to an exemplary embodiment of the invention, a process of forming a general planar type transistor is used, reducing costs; and a gate electrode is formed by a damascene process, preventing or substantially reducing a short between gate electrodes, and making a gate electrode separation adequate. In addition, forming a fin only on a gate formation region is advantageous for a contact and silicide formation, and a mask pattern to form a device isolation film is not removed, thereby preventing or substantially reducing damage to the active region in a post process.

Embodiments of the invention may be practiced in many ways. What follows are exemplary, non-limiting descriptions of some of these embodiments.

One exemplary embodiment of the invention provides a method of fabricating a FinFET. The method includes forming a device isolation film and an active region on a semiconductor substrate by using a first mask pattern to expose only a region where the device isolation film will be formed; selectively etching only the device isolation film by using a second mask pattern and the first mask pattern as an etch mask to expose a portion of both sidewalls of the active region, and to form a fin only on a gate formation region, the second mask pattern to expose only a region where a gate electrode will be formed; forming a gate insulation layer in both sidewalls of the fin and forming a gate electrode that covers the first mask pattern and the gate insulation layer; and forming source and drain regions on the remaining portion of the active region where the gate electrode was not formed, the gate electrode being formed between the source and drain regions.

After forming the fin, a trimming process to control thickness between both sidewalls of the fin may be further performed. The trimming process may be obtained by repeatedly performing processes of growing an oxide layer in both sidewalls of the fin and removing the grown oxide layer by an etching process.

Another exemplary embodiment of the invention provides a method of fabricating a FinFET. The method includes forming a device isolation film to define an active region by using a first mask pattern formed on a semiconductor substrate; forming a second mask pattern to expose a portion where a gate electrode will be formed on an entire face of the semiconductor substrate where the device isolation film was formed; etching, to a predetermined depth, the device isolation film corresponding to the portion on which the gate electrode will be formed, by using the first and second mask patterns as an etch mask, so as to expose a portion of both sidewalls of the active region, and to form a fin only on a gate formation region; forming a gate insulation layer in both sidewalls of the fin, and forming a gate electrode that fills both sidewalls of the fin in which the gate insulation layer was formed, and that has a height equal to an upper height of the second mask pattern; and removing a first mask pattern and a second mask pattern corresponding to the remaining portion of the active region where the gate electrode was not formed, and then forming source and drain regions between where the gate electrodes are formed on the active region.

Material of the first mask pattern may be a nitride, and the second mask pattern may have a single layer structure of nitride or a multi-layer structure of nitride and oxide layers. The etching depth of the device isolation film for formation of the fin may be about 500 to about 2000 Å.

Such methodic configurations provide a reduction of costs and an adequate separation of gate electrodes. Additionally, this is advantageous for a contact or silicide formation of the source and drain regions, and damage to the active region can be substantially reduced.

It will be apparent to those skilled in the art that modifications and variations can be made in the present invention without deviating from the spirit or scope of the invention. For example, a formation procedure of a transistor, a shape of substrate, gate electrode and fin, or a configuration of layer material, may be varied, and fabricating processes may be added or deducted. Thus, it is intended that the present invention cover any such modifications and variations of this invention provided they come within the scope of the appended claims and their equivalents.

What is claimed is:

1. A method of fabricating a fin field effect transistor (FinFET), the method comprising:
   forming a device isolation film on a semiconductor substrate to define an active region in the semiconductor substrate, using a first mask pattern;
   selectively etching the device isolation film, using a second mask pattern and the first mask pattern as an etch mask, to expose a portion of both sidewalls of the active region and to form a fin only on a gate formation region, the second mask pattern exposing only a region where a gate electrode will be formed;
   forming a gate insulation layer on both sidewalls of the fin;
   forming a gate electrode that covers the first mask pattern and the gate insulation layer; and
   forming source and drain regions on the remaining portion of the active region where the gate electrode was not formed, the gate electrode located between the source and drain regions.

2. The method of claim 1, further comprising performing a trimming process to control a thickness between the both sidewalls of the fin, after forming the fin.

3. The method of claim 2, wherein the trimming process is performed by repeatedly growing an oxide layer on the both sidewalls of the fin and removing the grown oxide layer by an etching process.

4. The method of claim 3, wherein removing the grown oxide layer comprises wet etching.

5. The method of claim 1, wherein the gate insulation layer and the first mask pattern comprise nitride.

* * * * *